United States Patent
Pavlov et al.

[19]

[11] Patent Number: 6,002,338
[45] Date of Patent: Dec. 14, 1999

[54] METHOD AND SYSTEM FOR DETECTING FAILURES IN SELF-EXCITING SENSOR

[75] Inventors: Kevin Jerome Pavlov, Livonia; Michael James Fodera, St. Clair Shores, both of Mich.

[73] Assignee: Ford Global Technologies, Inc., Dearborn, Mich.

[21] Appl. No.: 08/929,514

[22] Filed: Sep. 15, 1997

[51] Int. Cl.$^6$ .................................................. G08B 21/00
[52] U.S. Cl. ...................... 340/635; 340/650; 340/651; 340/652; 340/653; 340/662; 340/663; 340/671; 340/672; 340/511
[58] Field of Search .................... 340/635, 650, 340/651, 652, 653, 662, 663, 671, 672, 511, 521; 324/537, 555, 500; 364/559; 73/514.33, 728

[56] References Cited

U.S. PATENT DOCUMENTS

| | | | |
|---|---|---|---|
| 3,587,078 | 6/1971 | Elchmann | 340/518 |
| 3,919,703 | 11/1975 | Stevens | 340/511 |
| 3,973,257 | 8/1976 | Rowe | 340/511 |
| 4,155,080 | 5/1979 | Kovacs | 340/595 |
| 4,575,711 | 3/1986 | Suzuki et al. | 340/521 |
| 4,612,453 | 9/1986 | Yamazaki | 327/322 |
| 4,647,920 | 3/1987 | Corso | 340/650 |
| 4,654,645 | 3/1987 | Yamagishi | 340/635 |
| 4,665,384 | 5/1987 | Ouchi | 340/534 |
| 4,816,673 | 3/1989 | Segerson et al. | 250/239 |
| 4,841,286 | 6/1989 | Kummer | 340/653 |
| 4,845,435 | 7/1989 | Bohan, Jr. | 324/537 |
| 4,972,816 | 11/1990 | Mausner | 123/399 |
| 4,996,657 | 2/1991 | Shiraishi et al. | 364/559 |
| 5,053,713 | 10/1991 | Henoch | 324/537 |
| 5,079,506 | 1/1992 | Choi | 324/549 |
| 5,294,890 | 3/1994 | Hemminger et al. | 324/549 |
| 5,473,253 | 12/1995 | Araki | 324/537 |
| 5,568,131 | 10/1996 | Sakai et al. | 340/648 |
| 5,673,278 | 9/1997 | Mills et al. | 340/870.04 |
| 5,777,468 | 7/1998 | Maher | 324/207.18 |
| 5,793,297 | 8/1998 | Takeuchi et al. | 340/635 |

*Primary Examiner*—Benjamin C. Lee
*Attorney, Agent, or Firm*—Jerome R. Drouillard; Roger L. May

[57] ABSTRACT

A method and system for detecting faults with a self-exciting sensor includes a monitor circuit coupled to the self-exciting sensor for monitoring a signal associated with the sensor and generating a failure signal. A voltage limiting circuit is coupled to a receiver circuit associated with the self-exciting sensor for generating a first output signal within a valid range of operation in the absence of the failure signal. The voltage limiting circuit also generates a second output signal outside the valid range of operation in response to the failure signal so as to eliminate the necessity of an additional input to control logic associated with the self-exciting sensor.

19 Claims, 2 Drawing Sheets

METHOD AND SYSTEM FOR DETECTING FAILURES IN SELF-EXCITING SENSOR

TECHNICAL FIELD

This invention relates to methods and systems for detecting failures in a self-exciting sensor such as, for example, an optically coupled, magnetically coupled or sonically coupled sensor.

BACKGROUND ART

Self-exciting sensors are used in many applications. Self-exciting sensors internally generate an excitation signal that is received by the sensor itself. The sensor then measures variations in the excitation signal to sense certain physical parameters. For example, an optically coupled sensor is utilized in sensing a relative position of an automotive steering wheel.

Some automotive vehicles incorporate a control system for carrying out given control in response to a steering angle calculated from the relative position. The typical optics-based position sensor includes an exciter ring concentrically surrounding a steering wheel shaft. Optical pulses are generated in accordance with rotation of the steering wheel when the driver operates the steering wheel. Information on the steering angle of the vehicle is obtained by means of a counter which counts signal pulses based on the optical signal pulses.

However, in the event that a failure occurs in the sensor itself, it is impossible to carry out proper control in response to the steering angle. Typically, a sensor is coupled to the position sensor to detect any failures associated with the sensor itself. However, it is desirable to eliminate such cost and unreliability associated with an additional sensor or input to a control logic when detecting a failure associated with the position sensor, or any other similar self-exciting sensor.

DISCLOSURE OF THE INVENTION

It is thus a general object of the present invention to detect failures in a self-exciting sensor without requiring additional inputs to control logic connected thereto.

In carrying out the above object and other objects, features, and advantages of the present invention, a method is provided for detecting failures associated with a self-exciting sensor having a transmitter circuit for transmitting an excitation signal and a receiver circuit for receiving the excitation signal and generating a corresponding output signal for receipt by control logic. The method includes the step of monitoring a signal associated with the sensor and generating a corresponding failure signal. The method also includes the step of generating a first output signal within a valid range of operation in the absence of the failure signal and for generating a second output signal outside the valid range of operation in response to the failure signal so as to eliminate the necessity of an additional input to the control logic.

In further carrying out the above object and other objects, features, and advantages of the present invention, a system is provided for carrying out the above method steps. The system includes a monitor circuit coupled to the self-exciting sensor for monitoring a signal associated with the sensor and generating a corresponding failure signal. The system further includes a voltage limiting circuit coupled to the second voltage source and the receiver circuit for generating the first output signal within a valid range of operation in the absence of the failure signal and for generating the second output signal outside the valid range of operation in response to the failure signal so as to eliminate the necessity of an additional input to the control logic.

The above object and other objects, features and advantages of the present invention are readily apparent from the following detailed description of the best mode for carrying out the invention when taken in connection with the accompanying drawings.

BEST MODES FOR CARRYING OUT THE INVENTION

Figure 1:
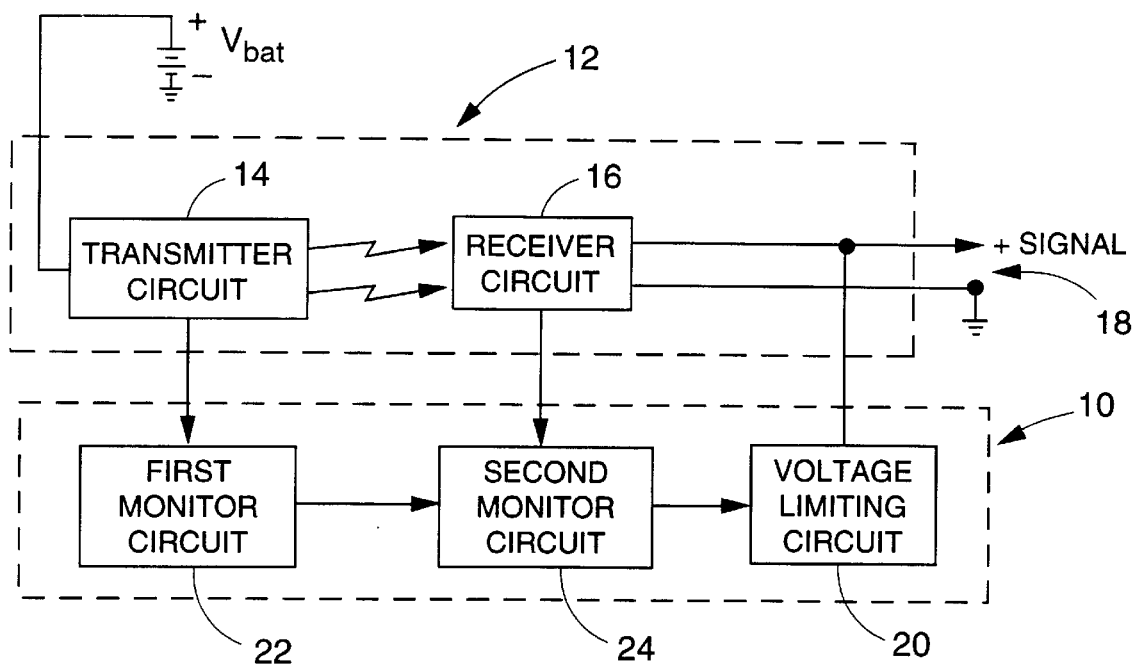
FIG. 1 is a simplified block diagram of the present invention.

Turning now to FIG. 1, there is shown a simplified block diagram of the system of the present invention, denoted generally by reference numeral 10, incorporated into a self-exciting sensor, denoted generally by reference numeral 12. The sensor 12 includes a transmitter circuit 14 for transmitting an excitation signal and a receiver circuit 16 for receiving the excitation signal and generating a corresponding output signal indicative of a physical parameter sensed by the sensor 12. The transmitter circuit 14 is powered by a voltage source, e.g., Vbat=8.0–16.0 VDC.

The sensor 12 also includes output terminals 18 for outputting the output signal. The receiver circuit 16 is powered by a separate power source, which may be incorporated in the voltage limiting circuit 20, to generate the output signal at the output terminals 18.

The system 10 includes a first monitor circuit 22 and a second monitor circuit 24 as well as a voltage limiting circuit 20. The first monitor circuit 22 is coupled to the transmitter circuit 14 for monitoring voltage drop generated from current flow in the transmitter circuit 14. The second monitor circuit 24 is driven by the first monitor circuit 22 and coupled to the receiver circuit 16 and the voltage limiting circuit 20. The second monitor circuit 24 monitors failures associated with the first monitor circuit 22 and also monitors failures associated with the voltage limiting circuit 20 by monitoring the output signal generated by the receiver circuit 16.

The voltage limiting circuit 20 is directly responsive to the second monitor circuit 24 and indirectly responsive to the first monitor circuit 22. Voltage limiting circuit 20 limits the operating voltage range to a voltage range having an upper limit and a lower limit. The sensor 12 typically operates in a peak voltage range, e.g., 0–5.0 VDC. The voltage limiting circuit 20 includes impedance elements for modifying the sensor 12 to output a signal in a predetermined voltage range within the typical or peak operating range. The upper limit of the typical operating range is reduced by a predetermined amount, e.g., 0.25 VDC, while the lower limit is increased by a predetermined amount, e.g., 0.25 VDC, so that the operating range is now 0.25–4.75 VDC.

Voltage limiting circuit 20 also limits the output signal from oscillating within a center fault zone defined within the voltage range, e.g., 0.75–4.0 VDC. If a failure occurs, voltage limiting circuit 20 will cause the output signal to oscillate not only outside the voltage range, but also within the center fault zone for more than a predetermined amount of time, e.g., 100 ms.

Thus, voltage limiting circuit 20 ensures that an output smaller than 0.25 VDC or greater than 4.75 VDC is not supplied as the output voltage during normal operation in the absence of failures. Nor is a signal generated between 0.75–4.0 VDC for more than 100 ms. It is now possible to detect failures with the sensor 12 when a voltage smaller than 0.25 VDC or greater than 4.5 VDC, or between 0.75–4.0 VDC for more than 100 ms is provided by the system 10 of the present invention.

By tying the excitation signal generated by the transmitter circuit 14 to the receiver circuit 16 via the first and second monitor circuits 22, 24, respectively, the sensor 12 can be monitored completely. Furthermore, the additional components of the monitor circuits 22, 24 themselves can be monitored by the system 10 via the voltage limiting circuit 20, as will be described in greater detail below.

Figure 2:
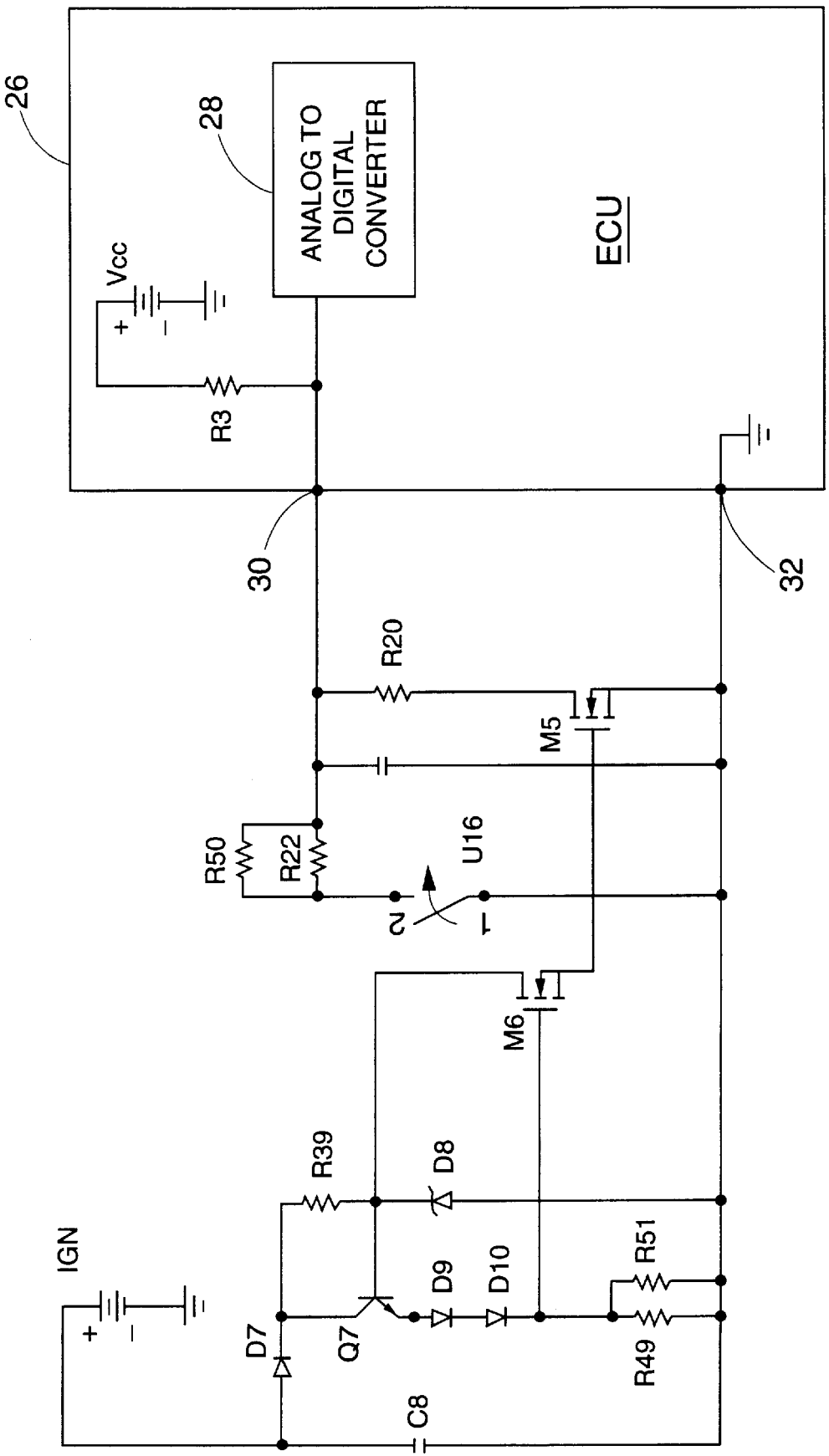
FIG. 2 is a schematic diagram of the monitoring circuit of the present invention for use with an optically coupled self-exciting sensor.

The system 10 of the present invention will be described in greater detail in conjunction with the schematic diagram of FIG. 2. The self-exciting sensor 12 depicted in FIG. 2 is an optically-coupled sensor, such as a relative position sensor, in which the output is connected to an electronic control unit (ECU). The present invention, however, can be used in conjunction with any other similar self-exciting sensor such as, for example, a magnetically coupled or a sonically coupled sensor.

The transmitter circuit 14 of the sensor 12 includes two optical transmitters D9, D10, such as, for example, light emitting diodes (LEDs), for transmitting light. The receiver circuit 16 includes a corresponding receiver U16, represented as a switch in FIG. 2, for receiving the transmitted light. Although only one receiver 16 is shown, the sensor 12 shown in FIG. 2 actually includes a second receiver, or switch, so that there is a receiver for each optical transmitter D9, D10.

A relative position sensor is typically positioned in proximity to an exciter ring (not shown) having several holes (or windows) therein representing predetermined angles. Thus, the sensor 12 transmits light via LEDs D9, D10 through the holes of the exciter ring for receipt by opposing optical receivers U16. The output voltage signal then changes with respect to the position of holes, and is received by ECU 26.

ECU 26 includes the power supply, Vcc, for the receiver circuit 16, which is typically 4.75–5.25 VDC. ECU 26 also includes an analog-to-digital (A/D) converter 28 for converting the analog output of the receiver circuit 16 into a digital signal for processing by ECU 26. Receiver circuit 16 includes output terminals 30, 32 wherein terminal 32 is coupled to Vcc and terminal 32 is coupled to ground.

Typically, the output voltage for receiver circuit 16 would range from ground level, or 0 VDC, to peak operating voltage Vcc. However, the voltage limiting circuit 20 limits the operating range to 0.25 VDC–4.75 VDC, as described above. This is accomplished via three impedance elements.

The first impedance element includes a resistor R3 which creates a voltage divider having an impedance sufficient enough to pull up output terminal 30 when switch U16 is not receiving a signal from transmitter D9 or D10. Resistor R3, preferably 1 kohm, is coupled between Vcc and output terminal 30.

The second and third impedance elements act as a voltage divider in conjunction with resistor R3. The second impedance element includes a resistor R20 having an impedance significantly larger than the third impedance element and the resistor R3 so that when switch U16 is open and not receiving a signal from transmitter D9 or D10, a majority of the current flows through resistor R20. Resistor R20, preferably 7.4 kohm, is coupled in series with resistor R3 between signal output terminal 30 and the second monitor circuit 24, or transistor M5.

The third impedance element includes two resistors R50, R22, preferably 282 ohm each, acting as a Thevenin equivalent voltage divider element pulling up the low level of the normal operating voltage above ground level. The impedance of resistors R50, R22 is significantly small such that when the current is flowing through switch U16 when switch U16 is closed and receiving a signal from transmitter D9 or D10, a voltage divider is created which pulls the signal up from ground by a small amount. Resistors R50, R22 are connected in parallel with each other and in parallel with resistor R20 between signal output terminal 30 and switch U16.

Figure 3:
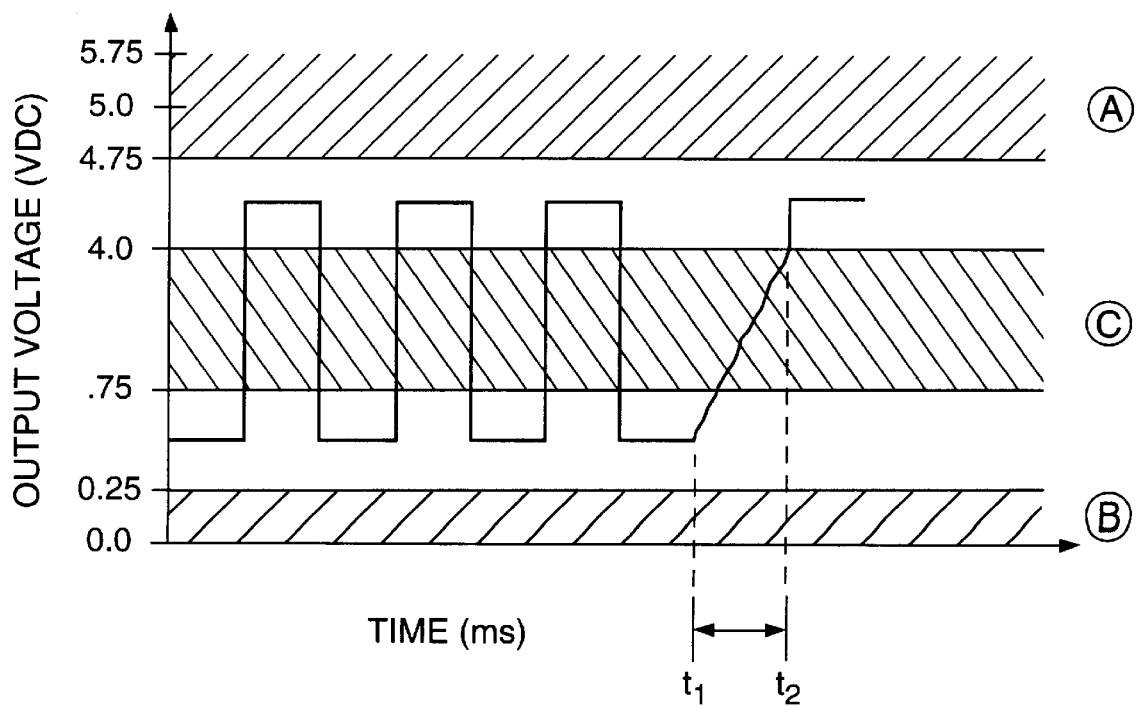
FIG. 3 is a graph illustrating the output signal generated by the monitoring circuit of the present invention.

Thus, voltage limiting circuit 20 creates a high fault zone A and a low fault zone B, as shown in FIG. 3. The output signal from the sensor 12 is a pulse that cycles, or oscillates, high and low between fault zones A and B during normal operation. If the signal has a voltage level within fault zone A or B, indicating a failure has occurred, ECU 26 can react accordingly.

Voltage limiting circuit 20 also creates a center fault zone C. If the output signal has a voltage level within the center fault zone C for more than a predetermined amount of time, t2-t1, e.g., 100 ms, the ECU 26 will detect a failure and react accordingly. The requirement that the output signal be within the center fault zone C for more than a predetermined time is to allow for voltage spikes or straying of the components of the sensor 12 and the system 10.

Failures with the sensor 12 and the system 10 itself are detected via first monitor circuit 22 and second monitor circuit 24. The first monitor circuit 22 includes a transistor, M6, and impedance elements R49, R51. Transistor M6 is preferably a MOSFET, e.g., IRF150, or, alternatively, may be a bi-polar transistor. M6 is coupled in parallel with a current drive transistor Q7 for diodes D9, D10 and the diodes D9, D10 themselves which are connected in series. The voltage drop created between the Thevenin equivalent resistance of the diodes D9, D10 and the current drive transistor Q7 is offset from ground with impedance elements R49, R51 so that there is a forward potential bias at M6. Thus, this offset is used to bias transistor M6 to an "ON" state during normal operation for monitoring a voltage difference across the transmitter circuit 14 and to an "OFF" state when the voltage difference does not fall within a predetermined amount. Two impedance elements R49, R51 are required so that the current limiting function of a resistance element will protect the transmitters D9, D10.

Power failure and power-related circuitry failure is detected by hardware-coupling the transistor M6 to the second monitor circuit 24, which is preferably a transistor, similar to M6. Transistor M5 is driven by transistor M6 so that when transistor M6 is turned "OFF" (i.e., sees a voltage difference outside of the predetermined window indicating a failure), transistor M5 is turned "OFF." When transistor M5 is turned "OFF," the signal output is pulled to either the upper fault zone A or the lower fault zone B depending on the state of the sensor 12.

Resistors R22, R50, R20 also cause the signal levels to be pulled down to low fault zone B if there is a short circuit failure in any of the wires. In contrast, resistor R3 causes the signal level to be pulled up to the high fault zone A if there is an open circuit failure in any of the wires.

Operation of the system 10 of the present invention will now be described. During normal operation, when there are no failures, if transmitter circuit 14 is transmitting a signal and switch U16 is open (no light is being received), the output signal at terminal 30 is at a voltage level divided by resistors R3 and R20, or approximately 4.5 VDC, since no current is flowing through resistors R50 and R22.

Similarly, if transmitter circuit 14 is transmitting a signal and switch U16 is closed (light is being received), the output signal at terminal 30 is at a voltage level essentially divided by R3, R22, and R50, e.g., 0.5 VDC, since R20 is so large and R22, R50 is so small.

When the transmitter circuit 14 has an open circuit in reverse battery protection diode D7, current driver Q7, or transmitters D9 or D10, transmitter M6 turns OFF since there is no forward bias, resulting in transistor M5 turning OFF and creating an open circuit in receiver circuit 16. Since no light is being transmitted, switch U16 is open circuit also. Consequently, the voltage at output terminal 30 is equal to Vcc which is within the high fault zone A.

Similarly, if any of the other components, IGN (or Vbat), reverse current protection diode D7, resistor R39, or zener diode D8 are open circuit or short circuit, transistor M6 will turn OFF causing transistor M5 to turn OFF. If one of the resistors R49, R51 fail (both resistors probably won't ever fail at the same time), the failure will cause one of Q7, D9 and D10 to eventually open circuit, which will then turn M6 and M5 OFF.

If the transmitter circuit 14 is operating correctly, but there is an open circuit at Vcc or R3 or a short circuit at Vcc, the voltage at output terminal 30 is equal to ground which is within the lower fault zone B.

If the transmitter circuit 14 is operating correctly, but there is an open circuit at R20, the output signal is pulled high to Vcc if the switch U16 is open. If the switch U16 is closed, the voltage at output terminal is divided between R3 and R22, R50 resulting in a voltage level within the center fault zone C. This output signal must stay in this zone for more than a predetermined amount of time in order for the ECU 26 to detect a failure, otherwise the resistor R20 could just be straying.

Assuming again that the transmitter circuit 14 is operating correctly, if R20 short circuits and switch U16 is closed, the output signal will be pulled to ground. If on the other hand, R22 or R50 open circuits and the switch U16 is closed, the voltage of output signal will be divided between R3 and R20 and one of R22 or R50 which falls in the center fault zone C. If R22 or R50 short circuits while the switch U16 is closed, the output voltage will be pulled to ground.

The monitoring system of the present invention ties the excitation status of a self-exciting sensor to the output of the sensor so that a failure in the sensor itself can be detected by monitoring the output voltage of the sensor. Furthermore, the voltage limiting circuit of the present invention is able to detect sleeping mode failures, i.e., failures in the monitoring system itself. The added expense and increased reliability due to additional sensor hardware is thus reduced significantly.

While the best modes for carrying out the invention have been described in detail, those familiar with the art to which this invention relates will recognize various alternative designs and embodiments for practicing the invention as defined by the following claims.

What is claimed is:

1. A method for detecting failures in a self-exciting sensor having a transmitter circuit for transmitting an excitation signal and a receiver circuit for receiving the excitation signal and generating a corresponding output signal for receipt by control logic, the method comprising:

monitoring a signal associated with the sensor to determine if a failure condition exists; and generating a sensor output signal within a valid range of operation in the absence of a failure condition and using a monitored failure condition as a modifier to the sensor output signal so that the modified sensor output signal is outside the valid range of operation to eliminate the necessity of an additional input to the control logic.

2. The method as recited in claim 1 wherein the valid range of operation includes a first lower limit and a first upper limit and wherein generating the sensor output signal within the valid range of operation includes generating the sensor output signal between the first upper and lower limits.

3. The method as recited in claim 2 wherein the valid range of operation further includes a second lower limit and a second upper limit within the first upper and lower limits and wherein generating the sensor output signal within the valid range of operation includes generating the sensor output signal from between the first and second lower limits to between the first and second upper limits without generating the sensor output signal between the second upper and lower limits for more than a predetermined amount of time.

4. The method as recited in claim 1 wherein monitoring the signal associated with the sensor comprises monitoring the excitation signal by monitoring a voltage supply from a voltage source to the transmitter circuit.

5. A system for detecting failures in a self-exciting sensor having a transmitter circuit for transmitting an excitation signal and a receiver circuit for receiving the excitation signal and generating a corresponding output signal for receipt by control logic, the system comprising:

a monitor circuit coupled to the self-exciting sensor for monitoring a signal associated with the sensor to determine if a failure condition exists; and a voltage limiting circuit coupled to the monitor circuit, a voltage source and the receiver circuit for generating a first output signal within a valid range of operation in the absence of a failure condition, the valid range having a first lower and upper limit, and wherein the voltage limiting circuit further modifies a second output signal to be outside the valid range of operation in response to detection of a failure condition so as to eliminate the necessity of an additional input to the control logic.

6. The system as recited in claim 5 wherein the first sensor output signal is within the valid range of operation when the first sensor output signal oscillates between the first upper and lower limits.

7. The system as recited in claim 6 wherein the valid range of operation further includes a second lower and upper limit within the first upper and lower limits and wherein the first output signal is within the valid range of operation when the first output signal oscillates from between the first and second lower limits and to between the first and second upper limits without oscillating between the second upper and lower limits for more than a predetermined amount of time.

8. The system as recited in claim 5 further comprising a voltage source coupled to the receiver circuit for supplying voltage to the receiver circuit and wherein the voltage limiting circuit comprises:

a first impedance element coupled to the voltage source and having an impedance sufficient to pull the first sensor output signal from the voltage source to below the first upper limit in the absence of a failure condition when the receiver circuit is not receiving the excitation signal;

a second impedance element coupled to the first impedance element and having an impedance greater than the impedance of the first impedance element so that when the receiver circuit is receiving the excitation signal a large percentage of the voltage source is received by the receiver circuit, and when the receiver circuit is not receiving the excitation signal the first sensor output signal is pulled down from the voltage source to below the first upper limit; and a third impedance element coupled to the first and second impedance elements and the receiver circuit, the third impedance element having an impedance less than the first and second impedance elements but sufficient enough to raise the first output signal to above the first lower limit when the receiver circuit is receiving the excitation signal.

9. The system as recited in claim 8 wherein the self-exciting sensor includes an output terminal and wherein the first impedance element comprises a first resistor coupled between the voltage source and the output terminal.

10. The system as recited in claim 9 wherein the second impedance element comprises a second resistor coupled in series to the first resistor between the output terminal and the monitor circuit.

11. The system as recited in claim 10 wherein the third impedance element comprises a third resistor coupled between the output terminal and the receiver circuit in parallel with the second resistor.

12. The system as recited in 11 wherein the third resistor includes a pair of resistors coupled in parallel.

13. The system as recited in claim 5 wherein the monitor circuit comprises:

a first monitoring circuit for monitoring the signal associated with the sensor; and a second monitoring circuit coupled to the first monitoring circuit for monitoring the first monitoring circuit and the voltage limiting circuit.

14. The system as recited in claim 13 wherein the first monitoring circuit comprises:

a first transistor having an ON state and an OFF state and a forward bias potential wherein the first transistor is in the ON state in the absence of a failure condition and in the OFF state in the presence of a failure condition; and a monitoring impedance element for keeping the forward bias potential of the first transistor above a ground level so as to keep the first transistor in the ON state in the absence of a failure condition and to turn the first transistor OFF in the presence of a failure condition.

15. The system as recited in claim 14 wherein the transmitter circuit includes a transmitter and a driver for driving the transmitter coupled in series with the transmitter and wherein the first transistor is coupled in parallel with the driver and the transmitter.

16. The system as recited in claim 15 wherein the monitoring impedance element includes a pair of resistors coupled in parallel between the series connection of the driver and the transmitter and a ground.

17. The system as recited in claim 14 wherein the first transistor is a field-effect transistor.

18. The system as recited in claim 14 wherein the first transistor is a bi-polar transistor.

19. A system for detecting failures in a self-exciting sensor having a transmitter circuit for transmitting an excitation signal and a receiver circuit for receiving the excitation signal and generating a corresponding output signal for receipt by control logic, the system comprising:

a monitor circuit coupled to the self-exciting sensor for monitoring a signal associated with the sensor and generating a corresponding failure signal, the monitor circuit comprising a first monitoring circuit for monitoring the signal associated with the sensor, and a second monitoring circuit coupled to the first monitoring circuit for monitoring the first monitoring circuit and the voltage limiting circuit; and a voltage limiting circuit coupled to the monitor circuit, a voltage source and the receiver circuit for generating a first output signal within a valid range of operation in the absence of the failure signal, the valid range having a first lower and upper limit, and wherein the voltage limiting circuit further for generating a second output signal outside the valid range of operation in response to the failure signal so as to eliminate the necessity of an additional input to the control logic.

\* \* \* \* \*